US006706576B1

United States Patent
Ngo et al.

(10) Patent No.: US 6,706,576 B1
(45) Date of Patent: Mar. 16, 2004

(54) LASER THERMAL ANNEALING OF SILICON NITRIDE FOR INCREASED DENSITY AND ETCH SELECTIVITY

(75) Inventors: Minh Van Ngo, Fremont, CA (US); Angela Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/096,741

(22) Filed: Mar. 14, 2002

(51) Int. Cl.[7] .................. H01L 21/00; H01L 21/336; H01L 21/8238; H01L 21/3205; H01L 21/4763
(52) U.S. Cl. .................. 438/197; 438/211; 438/257; 438/586; 438/587; 438/594; 438/634; 438/637; 438/672; 438/675
(58) Field of Search .................. 438/197, 211, 438/257, 586, 587, 594, 634, 637, 672, 675, 251, 261, 597

(56) References Cited

U.S. PATENT DOCUMENTS

| | | | | |
|---|---|---|---|---|
| 4,879,585 A | * | 11/1989 | Usami | |
| 4,933,206 A | * | 6/1990 | Cox | |
| 5,434,109 A | * | 7/1995 | Geissler et al. | |
| 5,436,494 A | * | 7/1995 | Moslehi | |
| 5,789,762 A | * | 8/1998 | Koyama et al. | |
| 5,914,498 A | * | 6/1999 | Suzawa et al. | |
| 6,534,421 B2 | * | 3/2003 | Kakkad | |
| 2002/0142546 A1 | * | 10/2002 | Kouznetsov et al. | |
| 2002/0160623 A1 | * | 10/2002 | Kakkad | |

FOREIGN PATENT DOCUMENTS

JP              56021320        *  2/1981

* cited by examiner

*Primary Examiner*—John F. Niebling
*Assistant Examiner*—Stanetta Isaac

(57) ABSTRACT

The density of a deposited silicon nitride layer is increased by laser thermal annealing in $N_2$, thereby increasing etch selectivity with respect to an overlying oxide and, hence, avoiding damage to underlying silicide layers and gates. Embodiments include laser thermal annealing a silicon nitride layer deposited as an etch stop layer, e.g., in fabricating EEPROMs, to increase its density by up to about 8%, thereby increasing its etch selectivity with respect to an overlying BPSG layer to about 1/12 to about 1/14.

20 Claims, 4 Drawing Sheets

LASER THERMAL ANNEALING OF SILICON NITRIDE FOR INCREASED DENSITY AND ETCH SELECTIVITY

FIELD OF THE INVENTION

The present invention relates to a method of manufacturing semiconductor devices having high reliability. The present invention has particular applicability in manufacturing high density, multi-level semiconductor devices with feature dimensions in the deep sub-micron regime.

BACKGROUND ART

Various issues arise in attempting to satisfy the ever increasing demands for miniaturization as the design rules plunge into the deep sub-micron regime. For example, it is extremely difficult to deposit high density dielectric layers, such as silicon nitride, with uniform film quality and deposition rate control so that they may effectively function as an etch stop layer without damage to an underlining gate stack or metal silicide layers, particularly in manufacturing non-volatile semiconductor devices, such as flash memory devices, e.g., electrically erasable programmable read only memory (EEPROM) devices. Adverting to FIG. 1, a typical single transistor flash EEPROM cell is schematically illustrated and comprises substrate 10, source region 11 and drain region 12 separated by a channel 13. A tunnel oxide 14 insulates substrate 10 from floating gate electrode 15 which, in turn, is insulated from control gate 16 by integrate or interpoly dielectric 17 typically having a three layer structure of silicon dioxide, silicon nitride and silicon dioxide commonly referred to as ONO. Floating gate 15 and control gate 16 are typically formed of doped polysilicon. A layer of oxide 18 is then grown or deposited with subsequent processing to form sidewall spacers. Such flash EEPROM devices offer many advantages; however, reliability issues arise, particularly as dimensions are scaled into the deep submicron regime.

In fabricating various EEPROM devices, as the gate width is scaled down to about 0.18 micron and under, etch selectivity of the silicon nitride etch stop layer with respect to an overlying oxide layer, such as a boron-phosphorus-silicate glass (BPSG), becomes more critical. In accordance with conventional practices, the as-deposited density of a silicon nitride etch stop layer, e.g., by plasma enhanced chemical vapor deposition (PECVD), is typically no greater than about 2.7 g/cm$^3$. A BPSG layer is deposited thereover and etching is conducted to form contact holes to underlying source/drain regions with metal silicide layers thereon, as well as contacts to gate structures. In accordance with conventional practices, the etch selectivity of the silicon nitride layer with respect to the overlying BPSG is about 1/7 to about 1/8 Such etch selectivity becomes problematic as micro-miniaturization increases resulting in damage to the metal silicide layers on the gate stack and on the source/drain regions upon etching contact holes.

Accordingly, there exists a need for methodology enabling the manufacture of semiconductor devices with improved reliability, particularly semiconductor devices containing typical MOS transistors as well as flash memory devices, such as EEPROMs. There exists a particular need for methodology enabling the deposition of dielectric layers, such as silicon nitride, with higher density, improved film quality and greater etch selectivity with respect to an overlying oxide layer.

DISCLOSURE OF THE INVENTION

An advantage of the present invention is a method of manufacturing a semiconductor device exhibiting improved reliability.

Another advantage of the present invention is a method of manufacturing flash memory semiconductor devices with high density silicon nitride etch stop layers having increased etch selectivity with respect to an overlying oxide layer.

Additional advantages and other features of the resent invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising depositing a layer of silicon nitride over a semiconductor substrate; and laser thermal annealing the layer of silicon nitride to increase its density.

Embodiments of the present invention comprise forming a non-volatile semiconductor device with metal silicide layers on the gate stack and on associated source/drain regions, depositing a silicon nitride layer, as by PECVD, over the non-volatile device, laser thermal annealing by impinging a pulsed laser light beam on an exposed surface of the silicon nitride layer at a radiant fluence of about 0.163 to about 0.229 joules/cm$^2$ in $N_2$ flowing at a rate of about 200 to about 2000 sccm, thereby elevating the temperature of the silicon nitride layer to about 600° C. to about 850° C. As a result of laser thermal annealing, the density of the silicon nitride layer is increased from an initial value of no greater than about 2.7 g/cm$^3$, to a density of about 2.75 to about 2.79 g/cm$^3$. An oxide layer is then deposited, such as a BPSG layer, and holes are etched through the BPSG layer stopping at the silicon nitride layer to form contact openings to the gate stack and/or source/drain regions. Laser thermal annealing advantageously increases the etch selectivity of the silicon nitride layer with respect to the subsequent deposited oxide layer as, for example, from an as deposited value of about 1/7 to about 1/8 to a value of about 1/12 to about 1/14. Such improved etch selectivity prevents damage to the underlying metal silicide layers on the gate stack and associated source/drain regions, thereby improving device reliability, particularly as dimensions are reduced to the sub-micron regime, such as a gate width of about 0.18 micron or less.

Additional advantages of the present invention will become readily apparent to those skilled in this art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
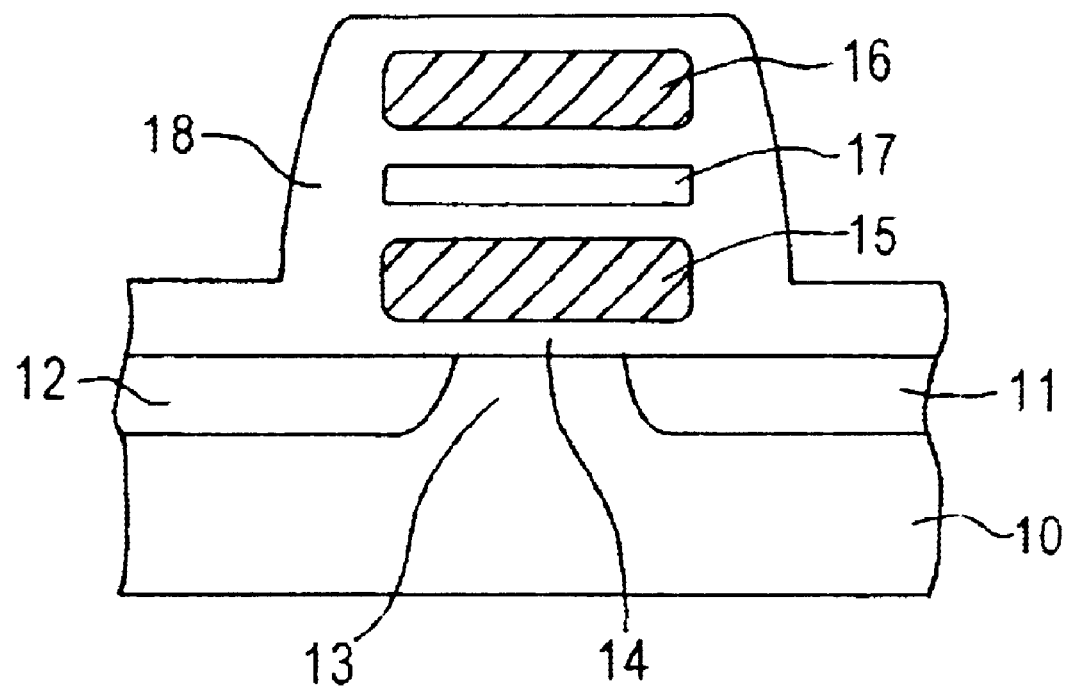
FIG. 1 schematically illustrates a flash EEPROM cell.

The present invention addresses and solves various reliability problems arising in fabricating semiconductor devices by providing efficient methodology enabling the fabrication of semiconductor devices exhibiting greater reliability. Embodiments of the present invention comprise manufacturing flash memory devices, such as EEPROM devices, with improved reliability by enabling the formation of silicon nitride etch stop layers with greater density and higher etch selectivity, thereby reducing damage to underlying gate stacks and source/drain regions, including metal silicide layers formed thereon. In addition, the present invention enables the fabrication of semiconductor devices with improved silicon nitride passivation layers.

Silicon nitride layers deposited in accordance with conventional PECVD techniques typically have a density no greater than about 2.7 g/cm$^3$ and an etch selectivity with respect to a subsequently deposited oxide layer, such as a BPSG layer, of about ⅐ to about ⅛. As miniaturization proceeds apace and gate widths are reduced to about 0.18 micron and less, such etch selectivity becomes problematic in that it is difficult to avoid damaging the underlying gate stack and source/drain regions, notably the metal silicide layers formed thereon. Accordingly, it is difficult to satisfy the demands for fabricating flash memory devices with gate widths of about 0.18 micron and less.

In accordance with embodiments of the present invention, a silicon nitride layer is deposited in a conventional manner, as by PECVD as at a thickness of about 450 Å to about 550 Å, e.g., about 500 Å, with an as-deposited density no greater than about 2.7 g/cm$^3$. Such an as-deposited silicon nitride layer typically exhibits an etch selectivity with respect to a subsequently deposited oxide layer, such as a BPSG layer, of about ⅐ to about ⅛.

In accordance with embodiments of the present invention, the as-deposited silicon nitride layer is subjected to laser thermal annealing, as by impinging a pulsed laser light beam on an exposed surface of the silicon nitride layer to increase its density and to increase its etch selectivity with respect to a subsequently deposited oxide layer. Embodiments of the present invention comprise laser thermal annealing to increase the density of the as-deposited silicon nitride layer by up to about 8%, e.g., to a density of about 2.75 to about 2.79 g/cm$^3$. Such laser thermal annealing also increases the etch selectivity of the as deposited silicon nitride layer to a value of about ½₀ to about ½₅ with respect to an overlying subsequently deposited oxide layer, e.g., layer of BPSG. A BPSG layer is then deposited and etching is conducted to form through holes through the BPSG stopping on the laser thermal annealed silicon nitride layer, thereby avoiding damage to the underlying metal silicide layers on the gate stack and associated source/drain regions.

Embodiments of the present invention comprise laser thermal annealing the as deposited silicon nitride layer by impinging on an exposed surface thereof a pulsed laser light beam as at a radiant fluence of about 0.163 to about 0.229 joules/cm$^2$ in nitrogen flowing at a rate of about 200 to about 2000 sccm. Such laser thermal annealing typically elevates the temperature of the silicon nitride film to about 650° C. and is typically performed quite rapidly, as for about 10 to about 100 nanoseconds.

The use of laser thermal annealing to elevate the density of the deposited silicon nitride layer and to increase its etch selectively with respect to a subsequently deposited oxide layer offers various advantages. For example, laser thermal annealing enable pinpoint accuracy in targeting the deposited silicon nitride layer, thereby avoiding elevating the temperature of other portions of the wafer thereby causing various problems, such as undue dopant impurity diffusion. Moreover, such localized temperature elevation during laser thermal annealing is very rapid in realm of nanoseconds.

In implementing embodiments of the present invention, any of various commercially available laser tools may be employed, such as those utilizing a laser source capable of operating at energies of about 10 to about 2000 mG/cm$^2$/pulse, e.g., about 100 to about 400 mJ/cm$^2$/pulse. Commercially available tools exist which can perform such laser annealing, either with or without mask. The Verdant Technologies laser anneal tool is but an example and operates at an exposure wavelength of 308 nm.

The mechanism underpinning the advantageous increase in density and increase in etch selectivity of an as-deposited silicon nitride layer is not known with certainty. However, it is believed that laser thermal annealing in accordance with embodiments of the present invention advantageously removes moisture and reduced the number Si—H bonds which results in an increased density and increased etch selectivity with respect to a subsequently deposited oxide layer.

In other embodiments of the present invention, a silicon nitride layer is deposited during various stages of fabricating various types of semiconductor devices, such as dielectric sidewall spacers, a dielectric layer overlying a metal layer, such as an aluminum or aluminum-based alloy layer, and as a topside passivation layer overlying the upper most metal level.

Figure 2:
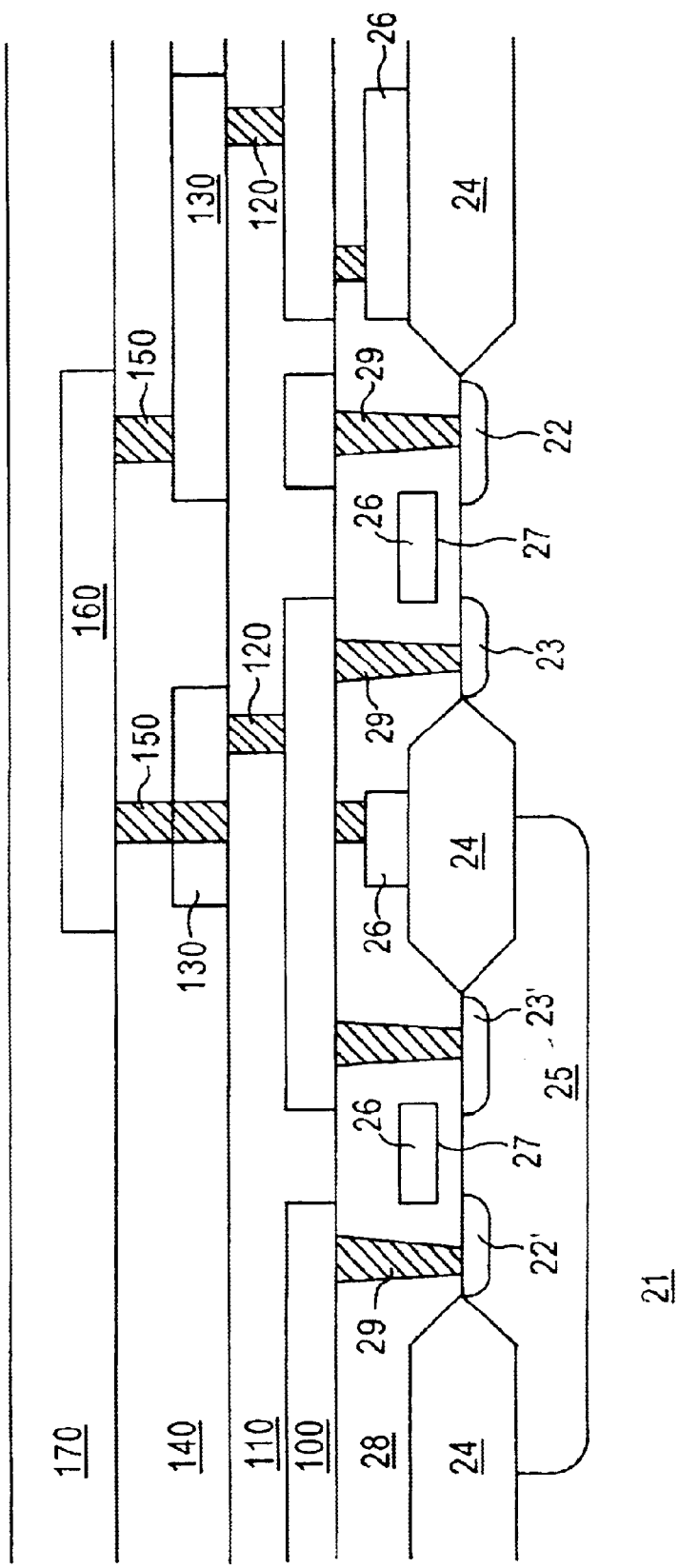
FIG. 2 schematically illustrates an embodiment of the present invention involving laser thermal annealing a silicon nitride topside passivation layer.

For example, adverting to FIG. 2, a semiconductor device is schematically depicted and comprises a substrate 21 having active regions comprising source 22, 22' and drain 23, 23' regions isolated by a field oxide region 24. Semiconductor substrate 21 can comprise a P-type impurity while well 25 comprises a N-type impurity. Gate electrodes 26, typically comprising polycrystalline silicon, are spaced apart from the active regions by gate oxide 27. First interlayer dielectric 28 comprises a plurality of contacts 29 for electrically connecting the active regions 22, 22' and 23, 23' with conductive patterns of the first conductive layer or level 100. Second interlayer dielectric 110 comprises a plurality of vias/plugs 120 for electrically connecting conductive patterns of the first conductive layer 100 with conductive patterns of the second conducive layer 130. Third, interlayer dielectric [conductive layer] 140 comprises a plurality of vias/plugs 150 for electrically connecting second conductive layer 130 to third conductive layer 160. A silicon nitride topside passivation or protective dielectric layer 170 is then formed. The conductive layers can comprise aluminum or aluminum-based alloy layers, although other metals can also be employed, such as copper and copper-based alloys. In accordance with embodiments of the present invention, the silicon nitride topside passivation or protective layer 170 is treated by laser thermal annealing to increase its density to a value of about 2.71 to about 2.73 g/cm$^3$.

With continued reference to FIG. 2, the final conductive layer, such as third conductive layer 160, is typically joined to a bonding pad (not shown) for forming an external electrical connection and, hence, is characterized as the wire bonding layer. The topside protective layer 170 of laser thermal annealed silicon nitride prevents contamination of the semiconductor device during assembly and provides resistance to moisturizing chemical attack.

Figure 3:
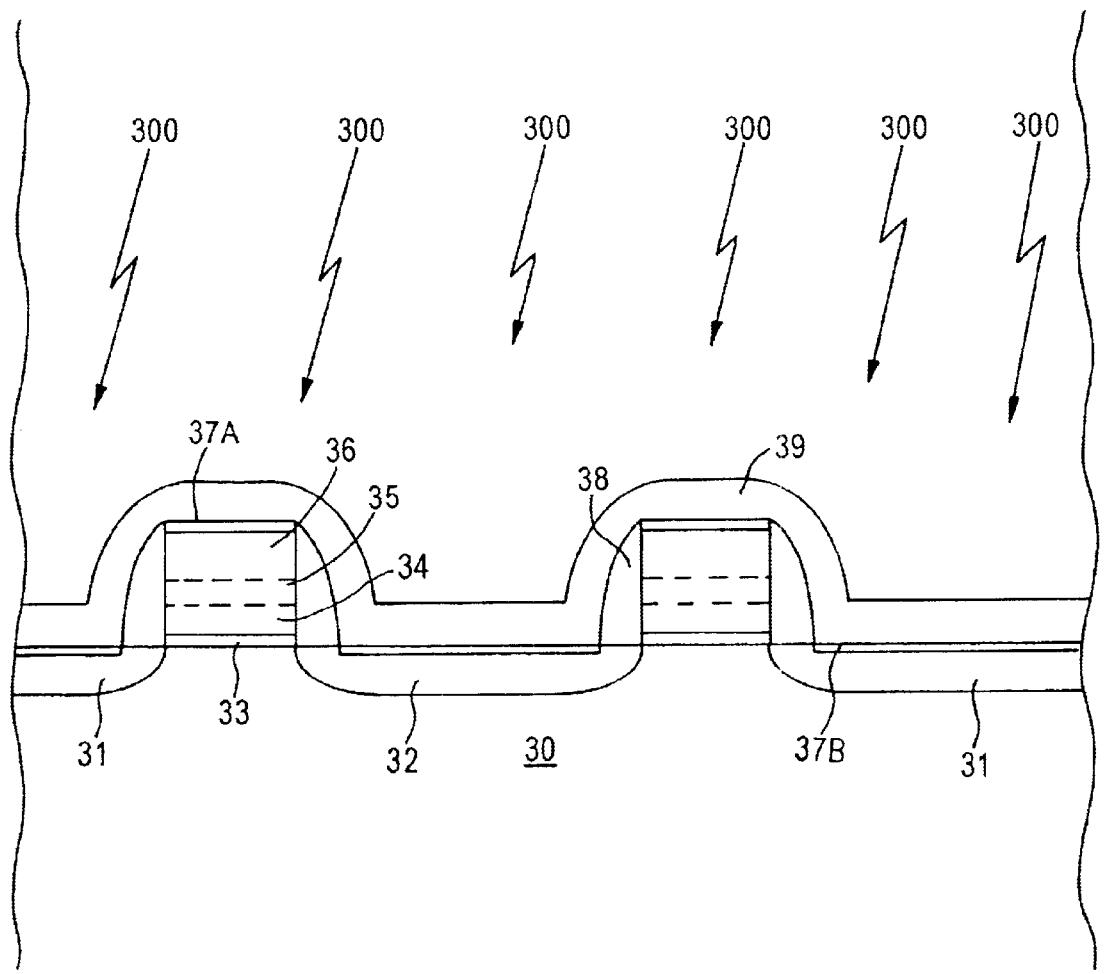
FIGS. 3 and 4 schematically illustrate sequential phases of a method in accordance with an embodiment of the present invention.
Figure 4:
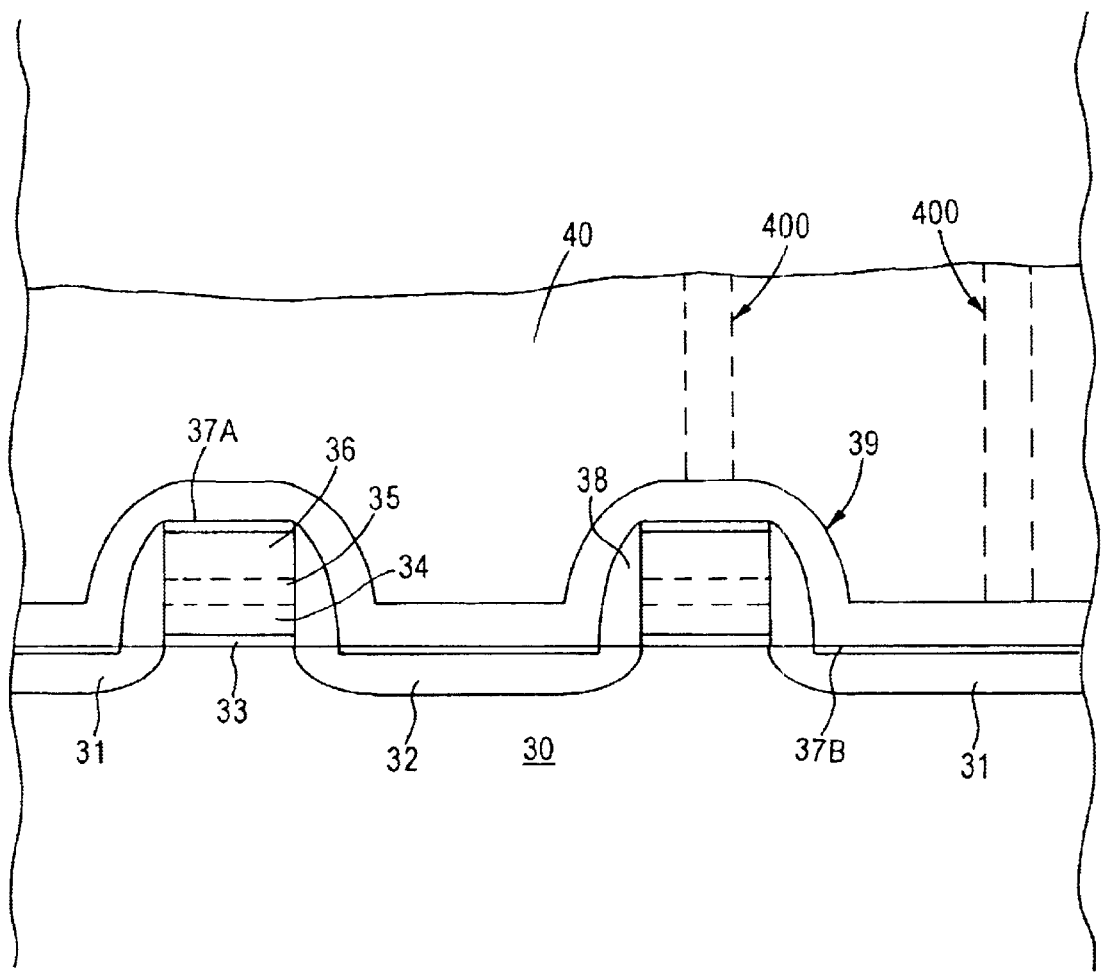

A method in accordance with an another embodiment of the present invention is schematically illustrated in FIG. 3 and 4, wherein similar elements and features are denoted by similar reference numerals. As schematically shown in FIG. 3, transistors are formed on substrate 30. The transistors can comprise MOS transistors and/or dual gate structures with an interpoly (ONO) dielectric therebetween. For example, the transistors can comprise tunnel oxide 33, a floating gate electrode 34, an ONO stack interpoly dielectric 35, and a control gate 36. A layer of metal silicide 37A is formed on an upper surface of the gate electrode stack while a layer of metal silicide 37B is formed on the source/drain regions 31, 32. A dielectric sidewall spacer 38 is formed on the side surfaces of the gate electrode. Sidewall spacer 38 can be formed of an oxide, such as silicon oxide, at a thickness of about 500 Å to about 5000 Å. Silicon nitride etch stop layer 39 is then deposited, as at a thickness of about 450 Å to about 550 Å, e.g., about 500 Å. Such silicon nitride layer exhibits an as deposited density not grater than about 2.7 g/cm$^3$ and etch selectivity with respect to a subsequently deposited oxide layer such as BPSG of about 1/7 to about 1/8.

In accordance with an embodiment of the present invention, the as-deposited silicon nitride layer 39 is then subjected to laser thermal annealing, as schematically illustrated by arrows 300, by impinging a pulsed laser light beam on an exposed surface of the as deposited silicon nitride layer 35, as at a radiant fluence of about 0.163 to about 0.229 joules/cm$^2$ for about 10 to about 100 nanoseconds, in $N_2$ flowing at a rate of about 200 to about 2000 sccm, thereby rapidly elevating the temperature of the as deposited silicon nitride layer 39 to about 600° C. to about 850° C. As a result of such laser thermal annealing, the density of the as-deposited silicon nitride layer 39 is elevated by up to about 8% as to a density of about 2.75 to about 2.79 g/cm$^3$, thereby increasing its etch selectivity with respect to a subsequently deposited oxide layer, such as BPSG, to a value of about 1/12 to about 1/14.

Adverting to FIG. 4, BPSG layer 40 is then deposited and anisotropic etching is implemented to form contact holes 400 shown in phantom, through interlayer dielectric 40. Advantageously, as a result of laser thermal annealing to increase the density of silicon nitride etch stop layer 39 and, hence, its etch selectivity with respect to BPSG layer 40, contact holes 400 can be etched stopping on silicon nitride layer 39, thereby avoiding damage the underlying metal silicide layers 37A, 37B. Subsequently, etching can be conducted through silicon nitride layer 39 to complete formation of the contact holes 400 without damage to the underlying metal silicide layers.

The present invention provides enabling methodology for fabricating semiconductor devices with improved reliability. In accordance with embodiments of the present invention, a silicon nitride layer is deposited in various aspects of semiconductor fabrication, such as etch stop layers, sidewall spacers and topside passivation layers as well as dielectric layers over loading metal layers. The as-deposited silicon nitride layer is then treated by laser thermal annealing to increase its density, thereby removing moisture and reducing the number Si—H bonds, and increasing its etch selectivity with respect to a subsequently deposited oxide layer. The present invention enjoys particular applicability in fabricating a non-volatile semiconductor devices with transistors having a gate width of about 0.18 micron or under with significantly reduced damage to underlying gate stacks and source/drain regions, including the metal silicide layers formed thereon.

The present invention enjoys industrial applicability in manufacturing various types of semiconductor devices, particularly highly integrated semiconductor devices exhibiting increased circuit speed and sub-micron dimensions, e.g., with a design rule of about 0.12 micron and under, with high reliability. The present invention enjoys particular industrial applicability in manufacturing flash memory devices, such as EEPROMs.

In the preceding detailed description, the present invention is described with reference to specifically exemplary embodiments thereof. It will, however, be evident that various modifications and changes may be made thereto without departing firm the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
   depositing a layer of silicon nitride over a semiconductor substrate; and
   laser thermal annealing the layer of silicon nitride in nitrogen ($N_2$) to increase its density.

2. The method according to claim 1, comprising laser thermal annealing in nitrogen ($N_2$).

3. The method according to claim 1, comprising laser thermal annealing at a $N_2$ flow rate of about 200 to about 2000 sccm.

4. The method according to claim 1, comprising laser thermal annealing by impinging a pulsed laser light beam on an exposed surface of the silicon nitride layer at a radiant fluence of about 0.163 to about 0.229 joules/cm$^2$.

5. The method according to claim 4, comprising a laser thermal annealing for about 10 to about 100 nanoseconds.

6. The method according to claim 1, comprising laser thermal annealing to elevate the temperature of the silicon nitride layer to about 600° C. to about 850° C.

7. The method according to claim 1, comprising a laser thermal annealing to increase the as deposited density of the silicon nitride layer by up to about 8%.

8. A method of manufacturing a semiconductor device, the method comprising:
   depositing a layer of silicon nitride over a semiconductor substrate; and
   laser thermal annealing the layer of silicon nitride to increase the density of the silicon nitride layer from an as deposited value of no greater than about 2.7 g/cm$^3$ to about 2.75 to about 2.79 g/cm$^3$.

9. The method according to claim 1, comprising depositing the layer of silicon nitride by plasma enhanced chemical vapor deposition.

10. The method according to claim 1, comprising:
    depositing an oxide layer over the silicon nitride layer after laser thermal annealing, wherein laser thermal annealing increases the etch selectivity of the silicon nitride layer with respect to the oxide layer.

11. The method according to claim 10, comprising depositing a boron-phosphorus-doped silicate glass (BPSG) layer as the oxide layer, wherein laser thermal anneal increases the etch selectivity of the silicon nitride layer with respect to the BPSG layer to about 1/12 to about 1/14.

12. A method of manufacturing a semiconductor device, the method comprising:
    forming at least one transistor on a semiconductor substrate, the transistor comprising:
      a gate electrode with a metal silicide layer thereon and dielectric sidewall spacers on side surfaces thereof; and
      source/drain regions with metal silicide layers there;
    depositing a silicon nitride layer on the transistor;

laser thermal annealing the silicon nitride layer to increase its density;

depositing an oxide layer over the silicon nitride layer after laser thermal annealing; and etching an opening through the oxide layer stopping on the silicon nitride layer, wherein the laser thermal annealing increases the etch selectivity of the silicon nitride layer with respect to the oxide layer.

13. The method according to claim 12, comprising depositing a boron-phosphorus-silicate glass (BPSG) as the oxide layer, wherein laser thermal annealing increases the etch selectivity of the silicon oxide layer with respect to the BPSG layer to a value of about 1/12 to about 1/14.

14. The method according to claim 12, comprising laser thermal annealing by impinging a pulse laser fight beam on an exposed surface of the silicon nitride layer at a radiant fluence of about 0.163 to about 0.229 joules/cm$^2$.

15. The method according to claim 14, comprising laser thermal annealing for about 10 to about 100 nanoseconds.

16. The method according to claim 14, comprising laser thermal annealing at a temperature of about 600° C. to about 850° C.

17. The method according to claim 14, comprising laser thermal annealing to increase the density of the silicon nitride layer by up to about 8%.

18. The method according to claim 14, comprising laser thermal annealing to increase the density of the silicon nitride layer from an as-deposited value of no greater than about 2.7 g/cm$^3$ to a value of about 2.75 to about 2.79 g/cm$^3$.

19. The method according to claim 12, wherein the gate electrode has a width of about 0.18 micron or less and comprises:

a tunnel oxide on a semiconductor substrate;

a floating gate electrode on the tunnel oxide;

an interpoly dielectrode comprising an oxide/nitride/oxide (ONO) stack on the floating gate;

a control gate electrode on the interpoly dielectric; and the metal silicide layer on the control gate.

20. A method of manufacturing a semiconductor device, the method comprising:

forming a non-volatile transistor comprising:

a gate stack comprising a tunnel oxide on a semiconductor substrate, a floating gate electrode on the tunnel oxide, an interpoly dielectric comprising an oxide/nitride/oxide (ONO) stack on the floating gate, a control gate electrode on the interpoly dielectric, and a metal silicide layer on the control gate;

dielectric sidewall spacers on the gate stack; and source/drain regions on opposite sides of the gate stack with a metal silicide layer thereon;

depositing a silicon nitride layer, having a density no greater than about 2.7 g/cm$^3$, on the non-volatile transistor at a thickness of about 450 Å to about 550 Å;

impinging a pulsed laser light beam on an exposed surface of the silicon nitride nitride layer at a radiant fluence of about 0.163 to about 0.229 joules/cm$^2$ in nitrogen flowing at a rate of about 200 to about 2000 sccm for about 10 to about 100 nanoseconds, thereby increasing the density of the silicon nitride layer to a value of about 2.75 to about 2.79 g/cm$^3$;

depositing a layer of boron-phosphorus-doped silicate glass (BPSG) over the silicon nitride layer after laser thermal annealing; and etching an opening through the BPGS layer stopping on the silicon nitride layer, wherein the laser thermal annealing increases the etch selectivity of the silicon nitride layer with respect to the BPGS layer to a value of about 1/12 to about 1/14.

* * * * *